(12) United States Patent
Bilstein

(10) Patent No.: US 11,115,016 B2
(45) Date of Patent: Sep. 7, 2021

(54) ELECTRONIC CIRCUIT WITH TWO VOLTAGE SUPPLY CIRCUITS

(71) Applicant: Infineon Technologies AG, Neubiberg (DE)

(72) Inventor: Denis Bilstein, Althegnenberg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 17/034,945

(22) Filed: Sep. 28, 2020

(65) Prior Publication Data

US 2021/0111713 A1 Apr. 15, 2021

(30) Foreign Application Priority Data

Oct. 15, 2019 (DE) .......................... 102019127798.1

(51) Int. Cl.
*H03K 17/042* (2006.01)
*H02M 3/335* (2006.01)

(52) U.S. Cl.
CPC ...... *H03K 17/042* (2013.01); *H02M 3/33569* (2013.01)

(58) Field of Classification Search
CPC .................................................. H03K 17/042
USPC ....................................................... 327/419
See application file for complete search history.

(56) References Cited

U.S. PATENT DOCUMENTS

2011/0121774 A1   5/2011   Shimada

FOREIGN PATENT DOCUMENTS

| DE | 19733707 A1 * | 2/1999 | ........... H02H 11/003 |
| DE | 19733707 A1 | 2/1999 | |
| DE | 102017118973 A1 * | 10/2018 | ............ H02M 3/158 |
| DE | 102017118973 A1 | 10/2018 | |
| DE | 102017219985 A1 | 5/2019 | |

* cited by examiner

*Primary Examiner* — Tomi Skibinski
(74) *Attorney, Agent, or Firm* — Slater Matsil, LLP

(57) ABSTRACT

An electronic circuit includes an output, and a first supply circuit and a second supply circuit, which are each connected to the output. The first supply circuit and the second supply circuit each include a supply input; a first circuit node; a first electronic switch; a first rectifier element connected in parallel with the first electronic switch; at least one second electronic switch that is connected between the supply input and the first circuit node; at least one second rectifier element that is connected in parallel with the at least one second switch, wherein the at least one second rectifier element and the first rectifier element are connected in antiseries with one another; and a control circuit. The control circuit activates the first switch and the second switch and receives a supply voltage from the first circuit node at a supply input.

20 Claims, 6 Drawing Sheets

ELECTRONIC CIRCUIT WITH TWO VOLTAGE SUPPLY CIRCUITS

CROSS-REFERENCE TO RELATED APPLICATIONS

This application claims the benefit of German Application No. 102019127798.1, filed on Oct. 15, 2019, which application is hereby incorporated herein by reference.

TECHNICAL FIELD

This description relates to an electronic circuit having two voltage supply circuits for supplying a load.

BACKGROUND

For safety reasons, for supplying power to safety-critical electronic assemblies (loads), such as in the automotive sector, two separate supply voltages are available, wherein in the event of a failure of one of the supply voltages a supply to the load should be ensured by the other supply voltage.

SUMMARY

An example of an electronic circuit capable of supplying a load using one of two supply voltages comprises a first supply voltage input, which is designed to receive a first supply voltage, a second supply voltage input which is designed to receive a second supply voltage, and an output which is designed to be connected to a load. In addition, the circuit comprises two rectifier elements, namely a first rectifier element that is connected between the first supply voltage input and the output, and a second rectifier element that is connected between the first supply voltage input and the output. The two rectifier elements are interconnected in antiseries, so that no current can flow between the two supply voltage inputs and the load is supplied in each case by the higher of the two supply voltages.

However, a possible fault, such as an open circuit in one of the rectifier elements, cannot be detected in such a circuit. Such a fault cannot be distinguished from a disconnection of the supply voltage. There is therefore a need for an electronic circuit which is capable of reliably supplying a load with one of two supply voltages, and in which potential faults arising in the circuit can be detected.

An example relates to an electronic circuit. The electronic circuit comprises an output designed to be connected to a load, and a first supply circuit and a second supply circuit, which are each connected to the output. The first and a second supply circuit each comprise a supply input which is designed to receive a respective input voltage; a first circuit node; a first electronic switch connected between the output and the first circuit node; a first rectifier element connected in parallel with the first electronic switch; at least one second electronic switch connected between the supply input and the first circuit node; at least one second rectifier element connected in parallel with the at least one second switch, wherein the at least one second rectifier element and the first rectifier element are connected in antiseries with one another; and a control circuit. The control circuit is designed to activate the first switch and the second switch and to receive a supply voltage from the first circuit node at a supply input.

BRIEF DESCRIPTION OF THE DRAWINGS

Examples are explained below based on drawings. The drawings are used to illustrate specific principles, so that only aspects necessary for understanding these principles are presented. The drawings are not to scale.

Figure 1:
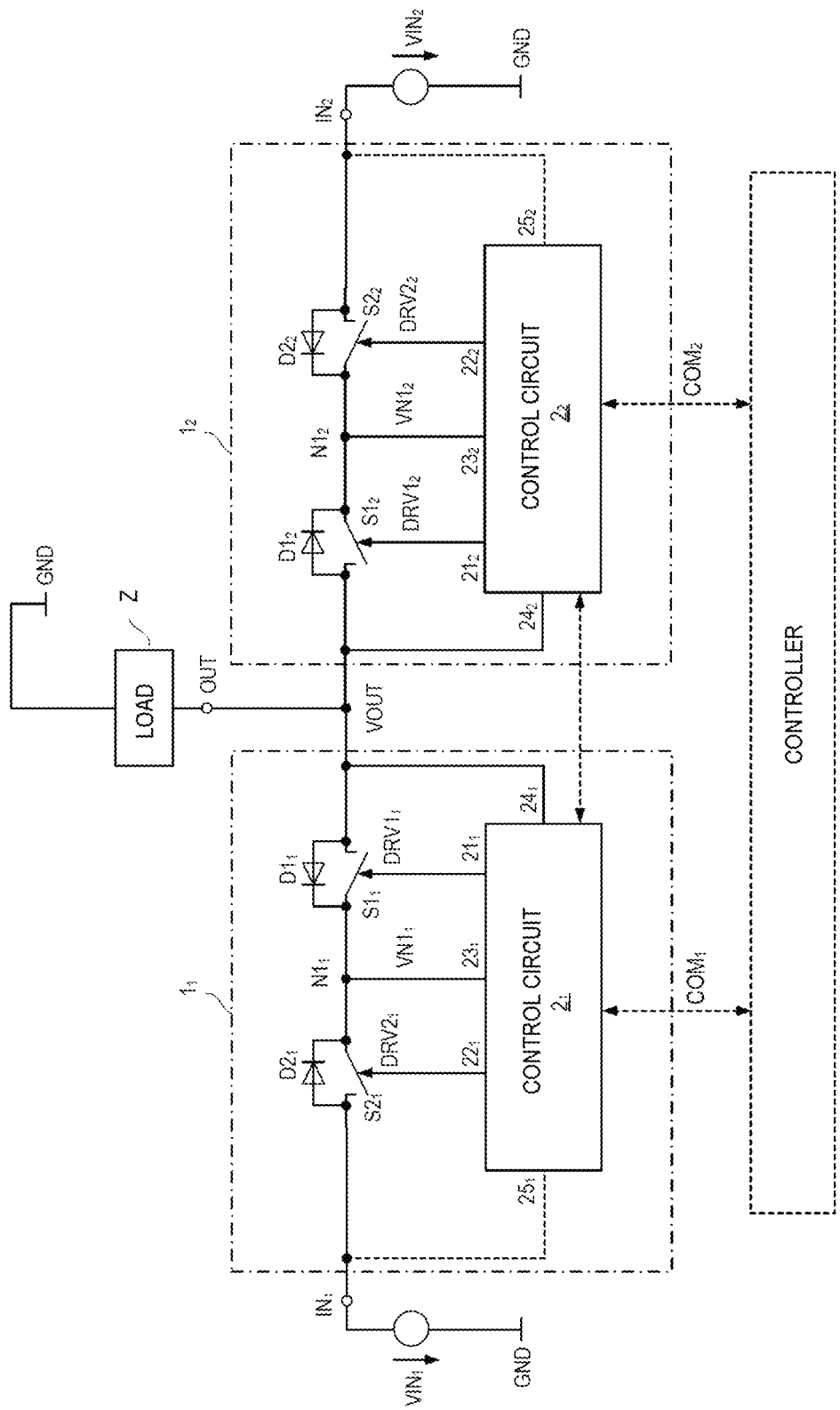
FIG. 1 shows an example of an electronic circuit having two supply circuits.

In the drawings, the same reference signs refer to the same features. In addition, it goes without saying that the features of the various exemplary embodiments described herein can be combined with one another, unless specifically stated otherwise.

DETAILED DESCRIPTION OF ILLUSTRATIVE EMBODIMENTS

FIG. 1 shows an example of an electronic circuit which is designed to supply a load Z with a supply voltage VOUT, which is also referred to hereafter as the output voltage. The load Z can be any electrical or electronic load, in particular a load that comprises a safety-related circuit, such as a microcontroller, an airbag control circuit or the like in a motor vehicle. In order to ensure the power supply of the load Z with a high degree of safety, the electronic circuit is designed to receive two input voltages $VIN_1$, $VIN_1$ and to generate the supply voltage VOUT based on these two input voltages $VIN_1$, $VIN_2$ in such a way that if one of the two input voltages $VIN_1$, $VIN_2$ fails, a voltage supply to the load Z is still guaranteed by the other of the two input voltages $VIN_1$, $VIN_2$.

The electronic circuit comprises an output OUT, which is designed to be connected to the load Z and at which the output voltage VOUT is available in the operation of the electronic circuit. In addition, the electronic circuit comprises two supply circuits, a first supply circuit 11 and a second supply circuit 12, each of which is connected to the output OUT. The two supply circuits 11, 12 each comprise a supply input $IN_1$, $IN_2$ which is designed to receive one of the two input voltages $VIN_1$, $VIN_2$ respectively. An input voltage of $VIN_1$ received by the first supply circuit 11 is hereafter also referred to as the first input voltage and an input voltage of $VIN_2$ received by the second supply circuit 12 is hereafter also referred to as the second input voltage.

The two supply circuits 11, 12 also each comprise a first circuit node $N1_1$, $N1_2$, a first electronic switch $S_1$, $S1_2$ which is connected between the output OUT and the respective first circuit nodes $N1_1$, $N1_2$, and a first rectifier element $D1_1$, $D1_2$ which is connected in parallel with the respective first electronic switch $S1_1$, $S1_2$. The first electronic switches $S1_1$, $S1_2$ can be any electronic switches, such as transistors, for example. Examples of the implementation of these first switches $S1_1$, $S1_2$ are explained below. The first rectifier elements $D1_1$, $D1_2$ are passive rectifier elements, for example. In the example shown in FIG. 1, these first rectifier elements $D1_1$, $D1_2$ are implemented as pn-diodes. But this is merely one example. Other types of passive rectifier elements, such as Schottky diodes, can also be used.

Referring to FIG. 1, each of the two supply circuits 11, 12 additionally comprises at least one second electronic switch $S2_1$, $S2_2$ which is connected between the respective supply input $IN_1$, $IN_2$ and the respective first circuit nodes $N1_1$, $N1_2$, and at least one second rectifier element $D2_1$, $D2_2$ which is connected in parallel with the at least one second switch $S2_1$, $S2_2$. The second switches $S2_1$, $S2_2$ can be implemented as any electronic switches, such as transistors, for example. Examples of the implementation of these second switches $S2_1$, $S2_2$ are explained below. The second rectifier elements $D2_1$, $D2_2$ are passive rectifier elements, for example. In the example shown in FIG. 1, these rectifier elements $D2_1$, $D2_2$ are bipolar diodes. But this is merely one example. Any other types of passive rectifier elements, such as Schottky diodes, could equally well be used. In the example shown in FIG. 1, each of the supply circuits 11, 12 comprises a second electronic switch $S2_1$, $S2_2$ and a second rectifier element $D2_1$, $D2_2$ connected in parallel. But this is merely one example. According to a further example which is explained below, more than one second switch can also be connected in series in the supply circuits 11, 12.

In the two supply circuits 11, 12, the first rectifier element $D1_1$, $D1_2$ and the second rectifier element $D2_1$, $D2_2$ are connected to each other in antiseries, which means that in normal operation of the electronic circuit no current can flow in either of the supply circuits 11, 12 between the respective input $IN_1$, $IN_2$ and the output OUT when the first switch $S1_1$, $S2_2$ and the second switch $S2_1$, $S2_2$ are open (switched off). According to one example, the first rectifier element $D1_1$, $D1_2$ and the second rectifier element $D2_1$, $D2_2$ in the supply circuits 11, 12 are in each case connected in antiseries in such a manner that when the first switch $S1_1$ $S1_2$ is open, a current can flow from the output OUT to the respective first circuit node $N1_1$, $N1_2$ when the electrical potential VOUT at the output OUT is higher than the electrical potential $VN1_1$, $VN1_2$ at the respective first circuit node $N1_1$, $N1_2$. In this description, the terms "voltage" and "potential" are used interchangeably. For purposes of explanation it is assumed that these voltages or potentials are related in each case to the same reference potential GND, such as earth, for example.

Referring to FIG. 1, the first and second rectifier elements $D1_1$, $D1_2$, $D2_1$, $D2_2$ in the two supply circuits 11, 12 are also connected in antiseries, such that with the second switch $S2_1$, $S2_2$ switched off a current can flow from the respective input node $IN1_1$, $IN1_2$ to the first circuit node $N1_1$, $N1_2$ when the respective input voltage $VIN_1$, $VIN_2$ is higher than the voltage or potential $VN1_1$, $VN1_2$ at the respective first circuit node $N1_1$, $N1_2$. This is achieved in the supply circuits 11, 12 shown in FIG. 1 by the fact that in each of the supply circuits 11, 12, cathodes of the diodes that form the respective first and second rectifier elements $D1_1$, $D1_2$, $D2_1$, $D2_2$ are connected to each other.

Referring to FIG. 1, each of the two supply circuits 11, 12 additionally comprises a control circuit 21, 22. The control circuit 21, 22 is designed to activate the respective first switch $S1_1$, $S1_2$ and the respective second switch $S2_1$, $S2_2$. The two control circuits 21, 22 can be designed in particular to activate the respective first switch $S1_1$, $S1_2$ depending on a voltage between the output OUT and the respective first circuit node $N1_1$, $N1_2$. For this purpose, the control circuits 21, 22 receive the output voltage VOUT (as shown) or a signal dependent on the output voltage VOUT (not shown) at a first measuring input $24_1$, $24_2$. According to an example, each of the control circuits 21, 22 is designed to activate the respective first switch $S1_1$, $S1_2$ into a conducting state when the electrical potential VOUT at the output is lower than the electrical potential $VN_1$, $VN_2$ at the respective first circuit node $N1_1$, $N1_2$. In addition, the control circuit 21, 22 is designed to receive a supply voltage $VN1_1$, $VN1_2$ from the respective first circuit node $N1_1$, $N1_2$ at a supply input $23_1$, $23_2$.

The first and second switches $S1_1$, $S1_2$, $S2_1$, $S2_2$ each have a control terminal for receiving an activation signal $DRV1_1$, $DRV1_2$, $DRV2_1$, $DRV2_2$ and will conduct or block depending on a signal level of the respective activation signal $DRV1_1$, $DRV1_2$, $DRV2_1$, $DRV2_2$. The control signals $DRV1_1$, $DRV1_2$, $DRV2_1$, DRV22 are generated by the respective control circuit 21, 22.

In the example shown in FIG. 1, circuit elements, circuit nodes and signals of the two supply circuits 11, 12 are provided with the same reference signs, which differ only by a subscript index "1" or by a subscript index "2". In the following description, if a distinction between the two supply circuits 11, 12 is not necessary, the reference signs shown in FIG. 1 are used in each case without a subscript index, so that hereafter, for example, the reference sign 1 designates one of the two supply circuits 11, 12 or both supply circuits, the reference sign $S_1$ designates one of the first switches $S1_1$, $S1_2$ or both of the first switches $S1_1$, $S1_2$, and so on.

Because in the electronic circuit according to FIG. 1, the control circuits 2 in the supply circuits 1 receive their respective supply voltage $VN_1$ via the first circuit node $N_1$, a voltage supply for both control circuits 2 is still guaranteed even if a failure of one of the two input voltages VIN has occurred. "A failure of one of the input voltages VIN" can occur, for example, if a short circuit to ground exists at the respective input IN, if a wiring connection between a voltage source providing the respective input voltage VIN and the input IN is broken, or if the input voltages VIN are provided by batteries and one of the batteries is empty.

According to one example, the control circuits 2 of the two supply circuits 1 are each implemented in such a way that the control circuit 2 of whichever of the two supply circuits 1 that receives the higher of the input voltages VIN switches on the first and second switch S1, $S_2$ respectively, while the control circuit 2 of whichever of the two supply circuits 1 that receives the lower of the two input voltages VIN switches off at least the second switch $S_1$. For example, if the first input voltage $VIN_1$ is higher than the second input voltage $VIN_2$, then (a) the control circuit 21 of the first supply circuit 11 switches on the first switch $S1_1$ and the second switch $S2_1$ in the first supply circuit 11 and (b) the control circuit 22 in the second supply circuit 12 switches off the second switch $S2_2$ in the second supply circuit 12. By switching off the second switch $S_2$ in that of the two supply circuits which receives the lower of the two input voltages $VIN_1$, $VIN_2$ at its input, a cross current is prevented from flowing between the two inputs IN. In the example explained previously, switching off the second switch $S2_2$ in the second supply circuit 12 thus prevents a cross current from flowing from the first input $IN_1$, at which the higher of the two input voltages $VIN_1$, $VIN_2$ is applied, to the second input, at which the lower of the two input voltages $VIN_1$, $VIN_2$ is applied.

In that of the two supply circuits 1 which receives the lower of the two input voltages, the associated first switch 1 can be switched on or off. In the example explained above, in which the second supply circuit 12 receives the lower of the two input voltages $VIN_1$, $VIN_2$, the associated first switch $S1_2$ can thus be (a) switched on or (b) switched off.

In the first case (a, $S1_2$ switched on), the second control circuit 22 receives the output voltage VOUT via the first switch $S1_2$ as supply voltage $VN1_2$. In the second case (a, $S1_2$ switched off), the second control circuit 22 receives the second input voltage $VIN_2$ via the rectifier element $D_2$ connected in parallel with the second switch $S2_2$ as the supply voltage $VN1_2$. With regard to the resulting power loss, the first case is more favorable since the power loss generated at the first switch $S1_2$, which is on, is usually lower than the power loss at the second rectifier element $D2_2$, which is operated in the forward direction.

This means that in the normal operation of the circuit, i.e. when sufficiently high input voltages VIN are present at both inputs IN, at least two of the switches are closed, namely the first and the second switch $S_1$, $S_2$ in that of the two supply circuits which receives the higher of the two input voltages VIN. Optionally, the first switch $S_1$ is also closed in that of the two supply circuits 1 which receives the lower of the two input voltages. "Sufficiently high" in connection with an input voltage VIN means that the input voltage VIN is suitable for supplying the load Z and the control circuits.

The fact that one of the two input voltages VIN is higher than the other of the input voltages VIN can be due to a failure of one of the two input voltages VIN or may also be due to the fact that the two input voltages VIN differ slightly from each other. The latter tends to be the normal case. If both input voltages VIN are approximately the same size, it can also be the case that both control circuits 2 also switch on the respective first and second switch $S_1$, $S_2$, thus providing a conductive connection between the two inputs IN. If the input voltages VIN are equal, however, this is not critical, as at most a small compensating current flows.

As explained, the first switches $S_1$ in both supply circuits 1 can be switched to the conducting state by the respective control circuit 2 as soon as a sufficient voltage supply for the respective control circuit 2 is available. In this case, the control circuits 2 are designed to activate the associated first switch $S_1$ into a conductive state as soon as they receive a sufficient supply voltage.

As an alternative, the control circuits 2 are designed to activate into a conductive state only the first switch $S_1$ in that of the two supply circuits 1 which receives the higher of the two input voltages VIN. In this case, the control circuits can be designed to compare the respective input voltage VIN or the voltage $VN_1$ at the first circuit node $N_1$ with the voltage VOUT at the output, and to switch the associated first switch $S_1$ to the conducting state only if the input voltage VIN or the voltage $VN_1$ at the first circuit node $N_1$ is greater than or at least equal to the output voltage VOUT.

To activate the second switches $S_2$, the control circuits 2 are designed, for example, to compare the respective input voltage VIN with the output voltage VOUT and to activate the second switch $S_2$ into a conductive state when the input voltage VIN at the input IN to which the second switch is connected is higher or at least equal to the output voltage VOUT. The input voltages VIN are fed to the control circuits via another measuring input 25, for example.

A voltage supply to both control circuits 2 is always guaranteed as long as one of the two supply voltages VIN is present, i.e. even if one of the two supply voltages should fail. For example, if the first input voltage $VIN_1$ fails, the first input voltage $VIN_1$ is zero, while the second supply voltage $VIN_2$ has a voltage level sufficient to supply the load Z and to supply the two control circuits 2, the control circuit 22 in the second voltage circuit 12 switches on the respective first and second switches $S1_2$, $S2_2$ so that the output voltage VOUT corresponds approximately (minus unavoidable small voltage drops across the switches $S1_2$, $S2_2$) to the second input voltage $VIN_2$. Either via the first rectifier element $D1_1$ in the first supply circuit 11 or via the first switched-on switch $S_1$, the control circuit 21 of the first supply circuit 11 receives a supply voltage $VN1_1$ which is approximately equal to the output voltage VOUT (minus the forward voltage of the first rectifier element $D1_1$). The supply voltage $VN1_2$ of the second control circuit 22 corresponds approximately to the output voltage VOUT. This means that both control circuits 21, 22 are supplied with a sufficient supply voltage even if one of the two input voltages $VIN_1$, $VIN_2$ fails.

According to one example, the control circuits 21, 22 measure the respective input voltage $VN1_1$, $VN1_2$ across the additional measuring input $25_1$, $25_2$ and output an error signal to a higher-level control unit (shown in dotted lines) via an optional communication connection $COM_1$, $COM_2$ if the respective input voltage $VN1_1$, $VN1_2$ drops below a specified threshold. In the example described above, in which the first input voltage $VIN_1$ fails, the control circuit 21 in the first supply circuit 11 could output an error signal via the corresponding communication connection $COM_1$ in spite of the failure of the first input voltage $VIN_1$, because it is ready for operation on account of the sufficient voltage supply via the first circuit node $N_1$.

As mentioned above, the first switches S1 can be implemented as any type of electronic switch. The first switches S1 in the two supply circuits 1 can be either electronic switches of the same type or electronic switches of different types. Examples of different switch types for implementing the first switches S1 are shown in FIGS. 2A and 2B.

Figure 2A:
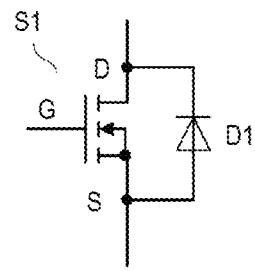
FIGS. 2A and 2B show examples of implementing a first switch which can be used in each of the supply circuits.
Figure 2B:
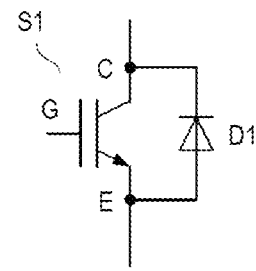

According to one example, at least one of the two first switches $S_1$ is implemented as a MOSFET, in particular as an n-conducting self-blocking MOSFET (n-type enhancement MOSFET), as shown in FIG. 2A. The first rectifier element $D_1$ can be an inherent body diode of the MOSFET, wherein in an n-conducting MOSFET an anode of the inherent body diode is formed by a source terminal S of the MOSFET and a cathode of the body diode is formed by a drain terminal D of the MOSFET. A control terminal for receiving the activation signal $DRV_1$ is formed by a gate terminal G of the MOSFET. In a MOSFET, the control signal $DRV_1$ is a voltage between the gate terminal G and the source terminal S, wherein the MOSFET conducts when this voltage is above a threshold voltage of the MOSFET, and blocks when this voltage is below a threshold voltage of the MOSFET.

Optionally, in the case of a MOSFET, in addition to the internal body diode an external rectifier element, such as a pn-diode or a Schottky diode, can be connected between the drain terminal D and the source terminal S, and thus in parallel with the internal body diode. The first rectifier element $D_1$ is then formed by the parallel circuit of the body diode and the external rectifier element.

According to one example, the first switches $S_1$ in both supply circuits 1 are each n-conducting self-blocking MOSFETs. In this case, the drain terminals D of the two MOSFETs are connected to the output OUT of the circuit in order to obtain a polarity of the first rectifier elements $D_1$, as shown in FIG. 1. This interconnection of the two MOSFETs used as first switches $S_1$ can be referred to as a common drain configuration.

According to another example, it is provided that at least one of the first switches $S_1$ is implemented as an IGBT, as shown in FIG. 2B. A control input of the IGBT is formed by a gate terminal. In an IGBT, the control signal is a voltage between the gate terminal G and an emitter terminal E. For example, when an IGBT is used as the first switch $S_1$, the first rectifier element $D_1$ can be an external rectifier element connected between a collector terminal C and the emitter terminal E of the IGBT in such a way that a current flows through the rectifier element $D_1$ when a positive voltage is applied between the emitter E and the collector C. If the rectifier element $D_1$ is implemented as a diode, this means that an anode of the diode is connected to the emitter E and a cathode of the diode is connected to the collector C of the IGBT. The diode is, for example, a pn-diode or a Schottky diode.

The realization of at least one of the first switches $S_1$ as a MOSFET, as shown in FIG. 2A, or as an IGBT, as shown in FIG. 2B, is merely an example. It goes without saying that any other type of transistor, such as a bipolar junction transistor (BJT), a junction field effect transistor (JFET), or a HEMT (High Electron Mobility Transistor), to name just a few examples, can be used for at least one of the two first switches $S_1$.

Figure 3A:
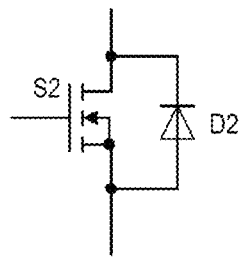
FIGS. 3A and 3B show examples of implementing of a second switch which can be used in each of the supply circuits.
Figure 3B:
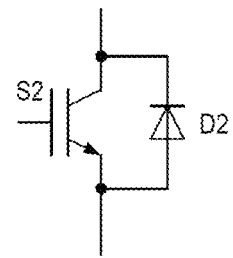

The above statements relating to the implementation of the first switches $S_1$ in the two supply circuits 1 apply in an appropriate way to the implementation of the at least one second switch $S_2$ in the two supply circuits 1. This means that the at least one second switch $S_2$ in at least one of the two supply circuits 1 can be implemented as a MOSFET, as shown in FIG. 3A, can be implemented as an IGBT as shown in FIG. 3B, or can be implemented as any other type of transistor, such as a BJT, a JFET or a HEMT. If more than one second switches are used in a supply circuit, the plurality of second switches can be either switches of the same type or switches of different types.

Figure 4:
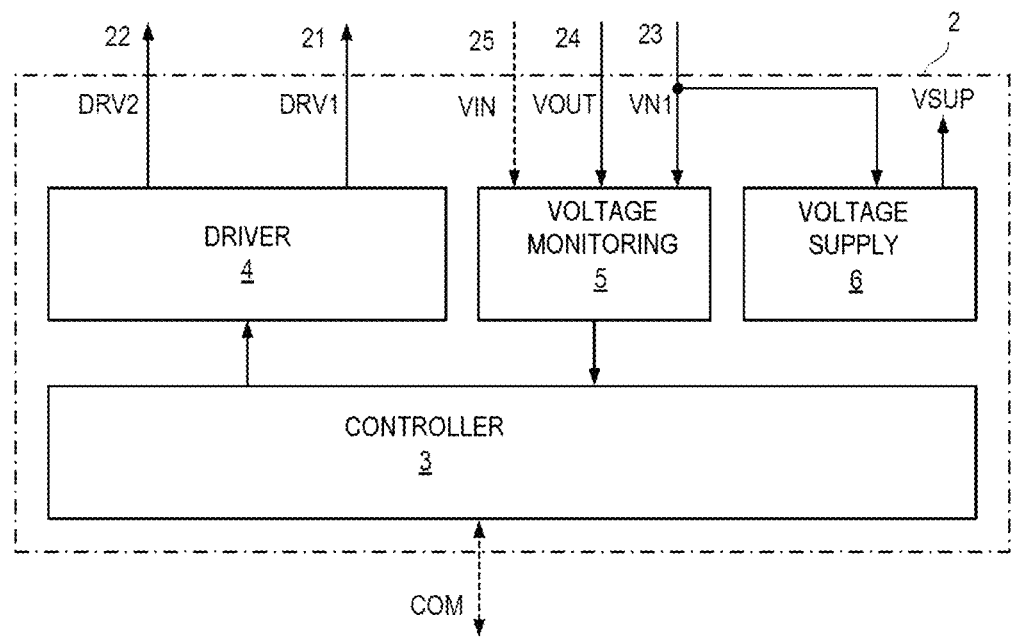
FIG. 4 shows an example of a control circuit that can be used in each of the supply circuits.

FIG. 4 shows a block diagram of an example of one of the two control circuits 2, wherein the control circuits 2 can be implemented in both supply circuits 1 according to the block diagram shown in FIG. 4. The block diagram according to FIG. 4 illustrates function blocks of the control circuit 2, but not a specific implementation. The function blocks shown in FIG. 4 can be implemented in different ways. According to one example, these function blocks are implemented using a dedicated circuit. According to another example, the control circuit is implemented using hardware and software. Thus, control circuit 2 can comprise, for example, a microcontroller and software that is executed by the microcontroller.

Referring to FIG. 4, the control circuit 2 comprises a driver 4 which is designed to generate the activation signals $DRV_1$, $DRV_2$ for the first switch $S_1$ and the at least one second switch $S_2$ activated by a controller 3. A voltage monitoring circuit 5 receives the output voltage VOUT and the voltage $VN_1$ at the first circuit node $N_1$ and is designed to supply signals representing these voltages VOUT, $VN_1$ to the controller 3 in order to enable the controller 3 to activate the first and second switches $S_1$, $S_2$ depending on these voltages VOUT, $VN_1$ in the manner explained above.

Referring to FIG. 4, the control circuit 2 also comprises a voltage supply circuit 6, which receives the voltage $VN_1$ at the first circuit node $N_1$ and is designed to generate at least one internal supply voltage VSUP for the individual function blocks based on the voltage $VN_1$ at the first circuit node $N_1$.

Figure 5:
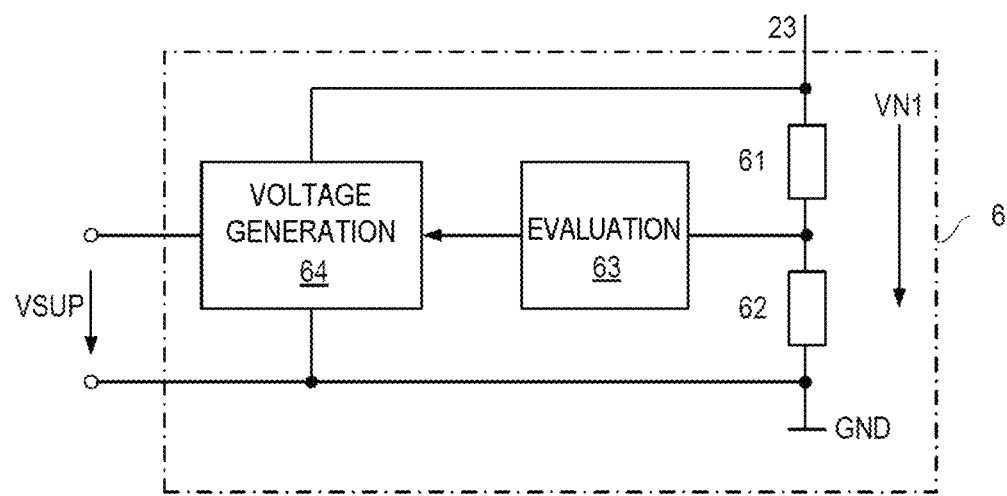
FIG. 5 shows an example of a voltage supply circuit in the control circuit.

An example of such a voltage supply circuit 6 is shown in more detail in FIG. 5. This voltage supply circuit comprises an evaluation circuit 63 and a voltage generation circuit 64 and is designed to generate an internal supply voltage VSUP for the control circuit 2 only if the voltage $VN_1$ received at the supply input 23 from the first circuit node $N_1$ is greater than a predefined threshold value. For this purpose, the evaluation circuit 63 receives the voltage $VN_1$ or, as shown, a voltage proportional to this voltage $VN_1$ from a voltage section 61, 62 and compares the voltage received with a threshold value. The evaluation circuit 63 is further designed to enable or disable the voltage generation circuit 64 for generating the internal supply voltage VSUP, wherein the evaluation circuit 63 enables the voltage supply circuit 64 if the received voltage value is above a predefined threshold value. To generate the internal supply voltage VSUP, the voltage generation circuit 64 receives, for example, the voltage $VN_1$ via the supply input 23.

As described above, each of the control circuits 2 can be designed to activate the associated first switch $S_1$ into a conductive state as soon as it receives a sufficient supply voltage or as soon as it receives a sufficient supply voltage and the electrical potential $VN_1$ at the first circuit node $N_1$ is higher than the potential VOUT at the output OUT. In the steady state, i.e. after the two input voltages VIN have been present for a certain length of time, this leads to a situation where the first switch $S_1$ of the supply circuits 1 which receives the higher of the two input voltages VIN is always switched on.

The "start phase" is used hereafter to refer to an operating phase between the application of the input voltages VIN and the achievement of this steady state of operation. The control circuits 2 can be implemented with different functionalities. Depending on the available functionality of the control circuits 2, different operating scenarios can occur during the start phase. Some examples are described below, wherein it is assumed initially that the two supply circuits 1 are each functioning correctly, and that the supply voltages VIN applied at the inputs IN of the two supply circuits are each sufficient to bring the control circuits 2 into an operationally ready state, a state in which the control circuits 2 are able to activate the first and second switches $S_1$, $S_2$.

In a first example, it is assumed that during the start phase the two supply voltages VIN are available at the inputs in a time-shifted manner, i.e. that there is a time delay between the presence of one of the two input voltages VIN and the presence of the other of the two input voltages VIN. Since the output voltage VOUT is initially zero, that of the two control circuits 2 which first receives a sufficient supply voltage $VN_1$ via the second rectifier element $D_2$ switches on the associated switch $S_1$. For example, if the first input voltage $VIN_1$ arrives before the second input voltage $VIN_2$, the first control circuit 21 switches on the first switch $S1_1$, which results in the output voltage VOUT being approximately equal to the first input voltage $VIN1_1$. After switching on the first switch $S1_1$ in the first supply circuit 11, the control circuit 22 in the second supply circuit 12 also receives an adequate voltage supply via the associated first rectifier element $D1_2$. As described above, this control circuit 22 can be designed to switch on the first switch 12 immediately after receiving a sufficient supply voltage, or only when the associated input voltage $VIN_2$ or the associated voltage $VN_1$ at the first circuit node $N1_2$ is also higher than the output voltage VOUT.

If that of the two supply voltages VIN which arrives later is lower than the supply voltage that is present first, the second switch $S_2$ and, optionally, the first switch $S_1$ of the supply circuit 1 which receives the lower input voltage VIN remains switched off. If in the example described above, therefore, the second input voltage $VIN_2$ is lower than the first supply voltage $VIN_1$, at least the second switch $S2_2$ of the second supply circuit 12 remains switched off because the output voltage VOUT, which corresponds approximately to the first input voltage $VIN_1$, is greater than the second input voltage $VIN_2$. If the second switch $S2_2$ of the second supply circuit 12 were switched on, a cross current would flow between the inputs $IN_1$, $IN_2$, which is undesirable.

If, on the other hand, that of the two input voltages VIN which arrives later is greater than the input voltage VIN that arrives first, then that of the two supply circuits 1 which receives the higher of the two input voltages VIN switches on the associated second switch $S_2$, while that of the two supply circuits 1 which receives the lower of the two input voltages VIN, applied first, switches off the associated second switch S2 again, to avoid a cross current between the two inputs IN. If in the example above, therefore, the second input voltage $VIN_2$ applied later is higher than the first input voltage $VIN_1$ applied first, then the control circuit 22 in the second supply circuit 12 detects that the voltage $VN1_2$ at the first circuit node $N1_2$ or the second input voltage $VIN_2$ is higher than the output voltage VOUT and switches on the associated second switch $S2_2$. As a result, the output voltage VOUT increases approximately to the value of the higher, second input voltage $VIN_2$. Thereupon the control circuit 21 of the first supply circuit 11 switches off the corresponding second switch $S2_1$, because the voltage $VN1_1$ at the first circuit node N1 or the first input voltage VIN is higher than the output voltage VOUT. The first switch $S1_1$ in the first supply circuit 11 can be switched off together with the second switch $S2_2$ or can remain switched on in order to supply the control circuit 21 in the first supply circuit 11 with the minimum possible losses via the output voltage VOUT.

In addition, different diagnostic functions can be implemented in the control circuits 2. Various examples of such diagnostic functions are explained below, wherein these diagnostic functions can be implemented in either of the two control circuits 2 or in both control circuits 2.

As explained above, one of the possible diagnostic functions relates to the input voltage VIN. Thus, at least one of the control circuits 2 can be designed to compare the received input voltage VIN with a threshold value and to output a corresponding error signal via the communication output COM if this input voltage VIN is below a predefined threshold value.

Another example relates to a short-circuit detection of the first and second switches $S_1$, $S_2$. In this example, at least one of the two control circuits 2 is designed to detect a short circuit of the first switch $S_1$ and the second switch $S_2$. For this purpose, the control circuit 2 detects the voltage across the first or second switch $S_1$, $S_2$ respectively when the switch is to be switched off by the respective activation signal $DRV_1$, $DRV_2$. If the voltage is lower than a predefined threshold value when the switch $S_1$, $S_2$ is in a blocking state, a short circuit in the respective switch is assumed. To detect the voltage across the first switch $S_1$, the control circuit 2 evaluates the difference between the voltages VOUT, $VN_1$ applied at the inputs 24, 23, and to determine the voltage across the second switch $S_2$, the control circuit 2 evaluates the difference between the voltages $VN_1$, VIN obtained at the inputs 23, 25.

Another example relates to an open-circuit detection of the first and second switches $S_1$, $S_2$. In this example, at least one of the two control circuits 2 is designed to detect an open circuit of the first switch $S_1$ and the second switch $S_2$. For this purpose, the control circuit 2 detects the voltage across the first or second switch $S_1$, $S_2$ respectively when the switch is to be switched on by the respective activation signal $DRV_1$, $DRV_2$. If the voltage is higher than a predefined threshold value when the switch $S_1$, $S_2$ is in the conducting state (switch $S_1$, $S_2$ is closed), an open circuit in the respective switch is assumed. To detect the voltage across the first switch $S_1$, the control circuit 2 evaluates the difference between the voltages VOUT, $VN_1$ applied at the inputs 21, 23, and to determine the voltage across the second switch $S_2$, the control circuit 2 evaluates the difference between the voltages $VN_1$, VIN obtained at the inputs 23, 25.

According to one example, the control circuit 2 is designed to output a corresponding error signal via the communication connection COM if a short circuit is detected in one of the two switches $S_1$, $S_2$. According to one example, the control circuit is also designed to switch off the respective other switch or keep it switched off if a short circuit is detected in either of the two switches $S_1$ or $S_2$.

Optionally, a communication channel (shown in FIG. 1 in dotted lines) can be present between the two control circuits 2. According to one example, the two control circuits 2 are designed to send a corresponding error signal to the other control circuits when a short circuit is detected in the associated first switch $S_1$. In addition, the control circuits 6 are designed to open the associated at least one second switch $S_2$ when such an error signal is received, in order to reliably avoid a cross current between the two inputs IN.

Alternatively or additionally, the higher-level control circuit can cause the at least one second switch in one of the supply circuits 1 to be switched off if a short circuit is detected in the first switch $S_1$ of the other supply circuit 1. If this function is additionally available, redundancy is achieved.

The higher-level control circuit (shown in dotted lines in the figures), which is coupled to the control circuits 2 via the communication connections COM, can initiate appropriate measures depending on the error signals received from the control circuits 2, such as switching off one of the supply voltages VIN or both supply voltages VIN.

Figure 6:
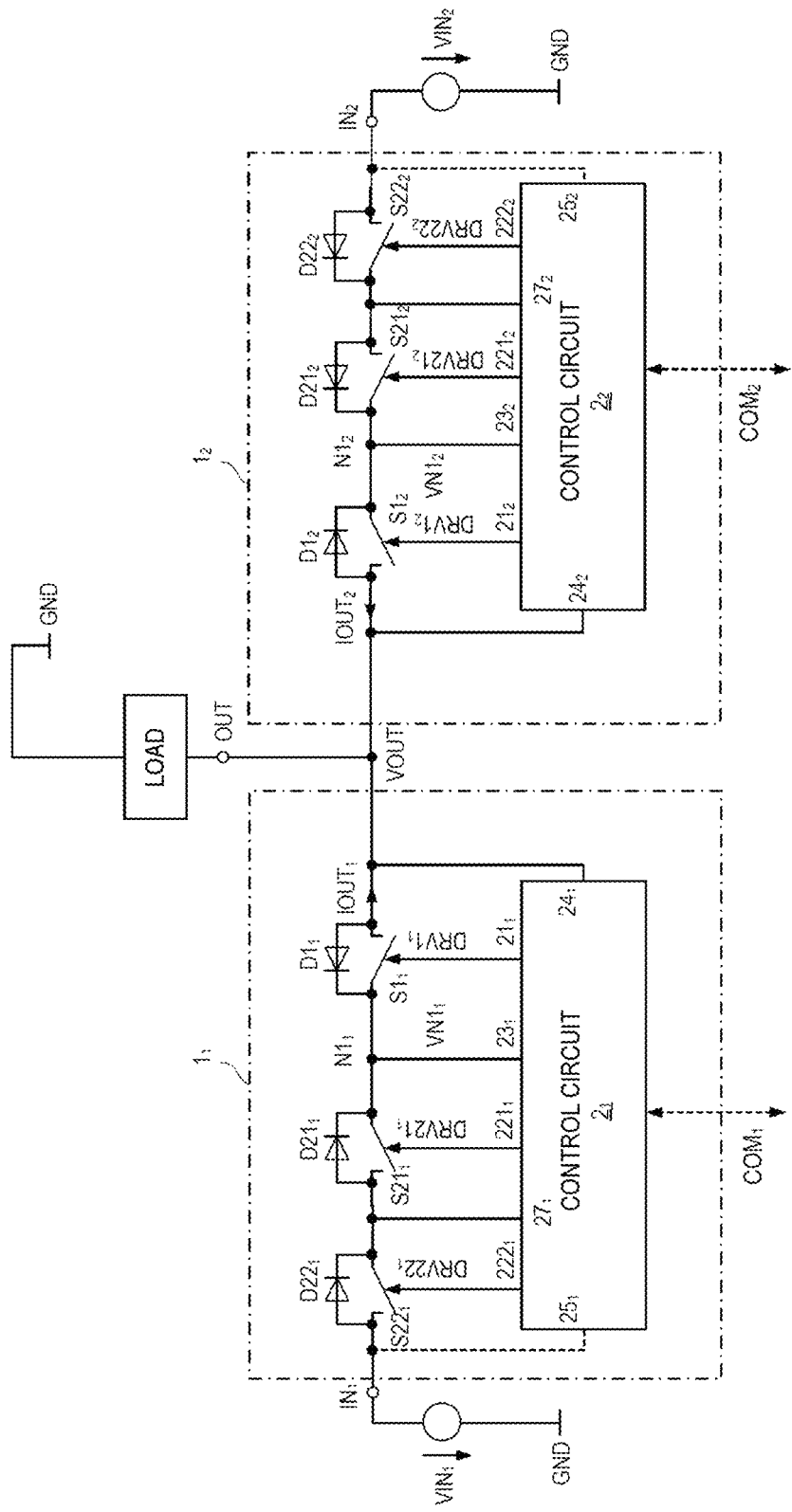
FIG. 6 shows another example of an electronic circuit with two supply circuits.

FIG. 6 shows another example of an electronic circuit with two supply circuits 11, 12. In this example, the two supply circuits 11, 12 each comprise two second switches $S21_1$, $S21_2$, $S22_1$, $S22_2$, which are connected in series between the respective input $IN_1$, $IN_2$ and the respective first circuit nodes $N1_1$, $N1_2$. In parallel with each of these second switches $S21_1$, $S21_2$, $S22_1$, $S22_2$, an associated rectifier element $D21_1$, $D21_2$, $D22_1$, $D22_2$ is connected. The second switches are generally referred to hereafter as $S2_1$, $S2_2$ and the two rectifier elements are generally referred to as $D2_1$, $D2_2$, whenever a distinction between the second switches or the second rectifier elements of the first and second supply circuit 11, 12 is unnecessary.

The second rectifier elements $D2_1$, $D2_2$ of each supply circuit 1 are connected in series in such a way that a current can flow between the respective input IN and the respective first circuit node $N_1$ when the voltage VIN at the input IN is higher than the voltage $VN_1$ at the first circuit node $N_1$.

In the example shown in FIG. 6, the control circuits 2 are designed, for example, to activate the associated second switches $S2_1$, $S2_2$ synchronously, i.e. to switch them on simultaneously or switch them off simultaneously. The two second switches of a supply circuit 1 are activated in the same manner as the activation of the one second switch $S_2$ described above in the exemplary embodiment according to FIG. 1.

The presence of the two series-connected second switches $S2_1$, $S2_2$ and the associated second rectifier elements $D2_1$, $D2_2$ increases the safety of the electronic circuit. If a short circuit is present in one of the two second switches $S2_1$, $S2_2$ while the other of the two switches $S2_1$, $S2_2$ is still intact, the functionality of the circuit is guaranteed.

According to one example, each of the control circuits 2 receives via an additional input 27 an electrical potential of the voltage present at a circuit node $N_2$ (where $N_2$ represents one of the circuit nodes $N2_1$, $N2_2$ shown in FIG. 6), which is located between the two second switches $S2_1$, $S2_2$. In this way, the control circuit 2 can detect the voltages across the two second switches $S2_1$, $S2_2$ and thus detect a short circuit or an open circuit in the two switches $S2_1$, $S2_2$. A short-circuit is present, for example, whenever a switch is activated in a blocking state and a voltage across the respective switch is less than a specified threshold value. A no-load condition is present, for example, when a voltage across the respective switch is above a predefined threshold value with the switch activated in a conducting state. According to one example, the control circuit 2 is designed to open the other of the two second switches $S2_1$, $S2_2$ and/or output an error signal via the communication connection when a short circuit is detected in one of the two second switches $S2_1$, $S2_2$.

Figure 7:
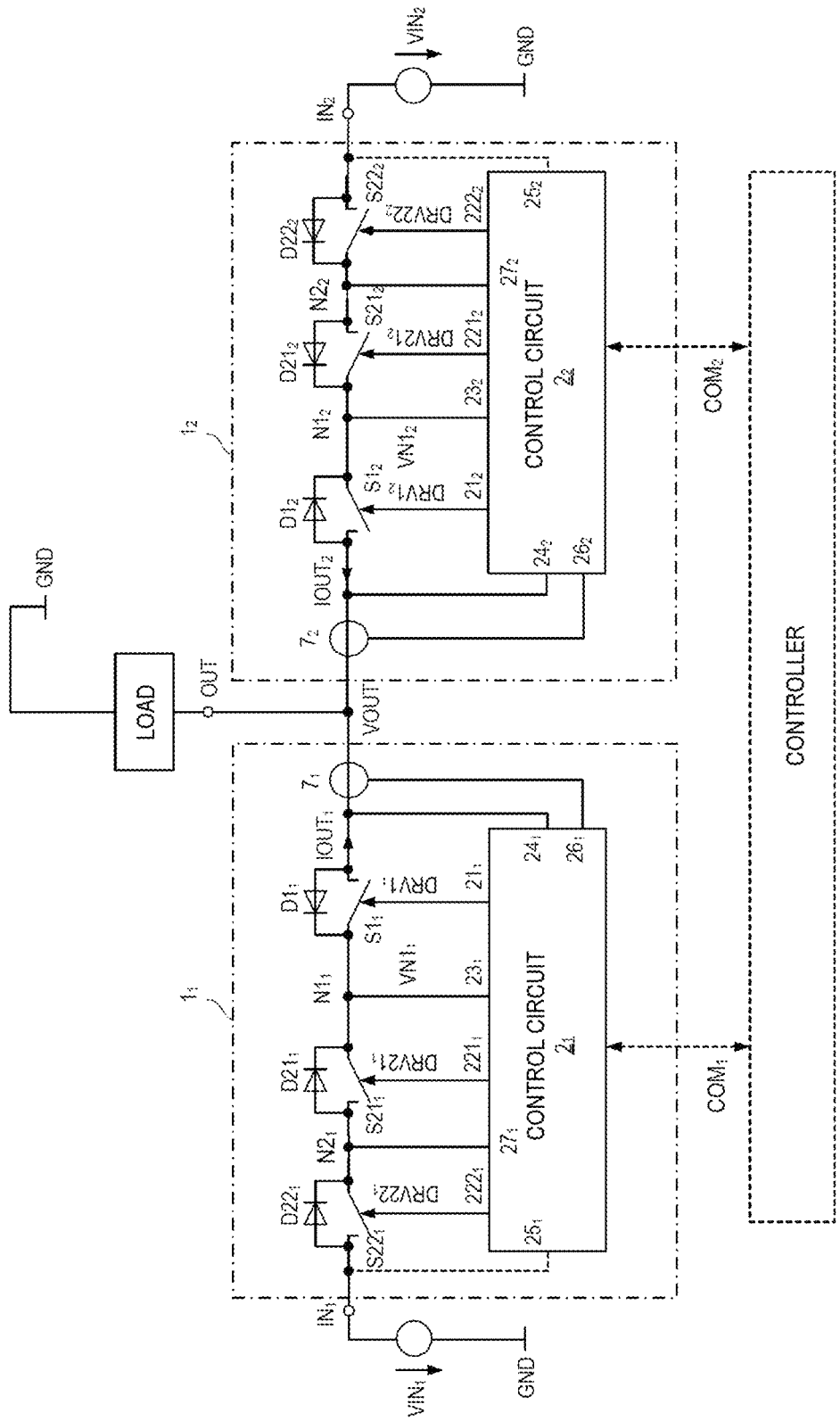
FIG. 7 shows a modification of the electronic circuit shown in FIG. 6.

FIG. 7 shows a further exemplary embodiment of the electronic circuit. In this exemplary embodiment, the supply circuits 1 each comprise a current sensing arrangement 71, 72 which is designed to detect at least one current direction of an output current $IOUT_1$, $IOUT_2$ flowing between the respective supply circuit 11, 12 and the output OUT. The current sensing circuits 71, 72 are only shown schematically in FIG. 7. These current sensing circuits 71, 72 can be implemented as any type of conventional current sensor, such as inductive current sensors, Hall sensors, sensors using a shunt resistor, or similar. The current sensing circuits 71, 72 are coupled to the control circuits 21, 22 via current measuring inputs $26_1$, $26_2$. In this electronic circuit, the control circuits 21, 22 are designed to take into account current measurement results provided by the current sensing circuits 71, 72 when activating the respective first switch $S1_1$, $S1_2$ and the at least one second switch. Examples of this are explained below.

In the example shown in FIG. 7, the supply circuits 1 each comprise two second switches $S2_1$, $S2_2$. But this is merely one example. Current sensing circuits 7 (wherein the reference sign 7 represents either one or both of the current sensing circuits 71, 72) can also be provided in the exemplary embodiment according to FIG. 1 in which only one second switch $S_2$ is present in each of the supply circuits 1.

Figure 8:
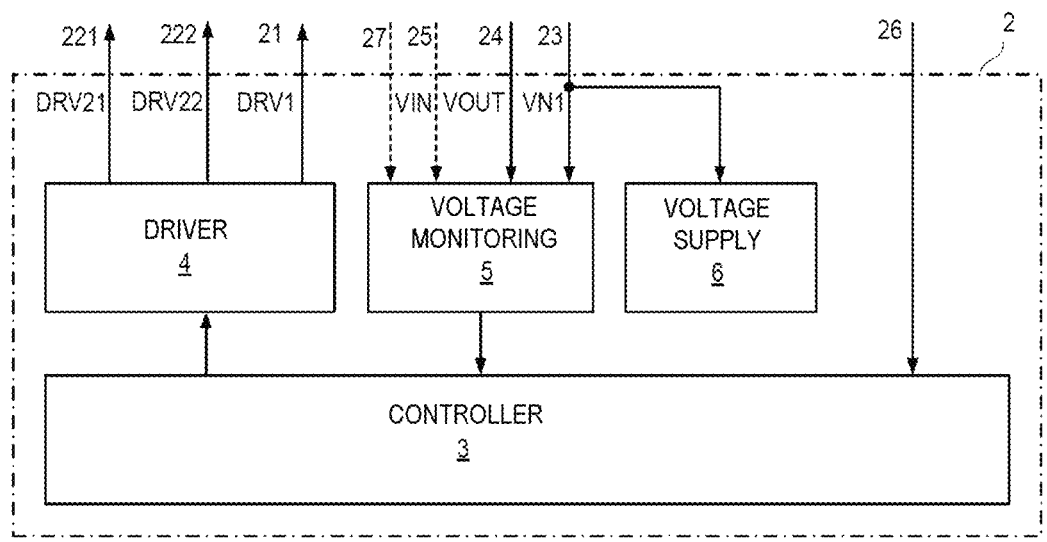
FIG. 8 shows an example of a control circuit that can be used in each of the supply circuits in accordance with FIGS. 6 and 7.

FIG. 8 shows an example of one of the two control circuits 2 in the electronic circuit shown in FIG. 7. This control circuit 2 differs from the control circuit described in FIG. 4 in that the controller 3 is coupled to the current measuring input 26 (wherein the reference sign 26 represents one of the current measuring inputs $26_1$, $26_2$ according to FIG. 7) in order to obtain the current measuring signal provided by the respective current sensing circuit 7.

In this example, the control circuit 2 is designed, for example, to activate the at least one second switch $S_2$ or $S2_1$, $S2_2$ in the blocking state if the current measuring signal $S_7$ received by the current sensing circuit 7 indicates that the associated output current IOUT has a negative sign, i.e. is flowing from the output OUT into the respective supply circuit 1. Such an output current IOUT with negative sign can occur, for example, when the voltage conditions at the inputs IN change, i.e. for example, when the hitherto lower of the two input voltages $VIN_1$, $VIN_2$ exceeds the hitherto higher of the two input voltages $VIN_1$, $VIN_2$. This is explained below.

For explanatory purposes, it is assumed that the first input voltage $VIN_1$ is initially the higher of the two input voltages $VIN_1$, $VIN_2$. In this case, the first switch $S_1$ and the at least one second switch $S21_1$, $S22_1$ of the first supply circuit 11 are activated in the conducting state by the control circuit 21, while at least the second switch $S2_2$ in the second supply circuit 12 is activated in the blocking state. If the second input voltage $VIN_2$ now exceeds the first input voltage $VIN_1$, the input voltage $VIN_2$ of the second supply circuit 12 exceeds the potential VOUT at the output OUT, so that the second control circuit 22 switches on the associated second switch $S2_2$. The output potential VOUT thus increases approximately up to the value of the now higher second input voltage $VIN_2$, which, due to the hitherto conductively activated at least one second switch $S21_1$, $S22_2$ (and the optionally conducting first switch $S1_1$) in the first supply circuit 11, a current can flow from the output OUT in the direction of the first input $IN_1$, which in effect means that the output current $IOUT_1$ of the first supply circuit 11 becomes negative. This negative current flow is detected by the current sensing circuit 71, so that the first control circuit 22 switches off the at least one second switch $S21_1$, $S22_2$ to prevent this current flow. In this case, according to one example the control circuit 21 also switches off the first switch $S1_1$ of the first supply circuit 11. The evaluation of the output currents $IOUT_1$, $IOUT_2$ for activation of the second switches $S2_1$, $S2_2$ in the blocking state can be performed alternatively or in addition to the comparison of the input voltages $VIN_1$, $VIN_2$ with the output voltage VOUT as explained above.

According to one example, at least one of the control circuits 2 is additionally designed to activate the corresponding first switch $S_1$ by pulse-width modulation, depending on a measured value provided by the respective current sensing circuit, in order to limit the output current IOUT. Such a current limitation can be useful in particular when the load has a capacitance that is charged after switching on the circuit. During charging of such a capacitance, high currents (inrush currents) can occur, which in turn can lead to high line losses in the supply circuits 1, and high line losses can give rise to a high thermal load on the components in the supply circuits 1. The control circuits 2 are designed, for example, to activate the associated first switch $S_1$ in pulse-width modulated mode if a current level of the output current is above a specified threshold value. According to one example, it is provided to measure the duration for which the first switch $S_1$ is activated in pulse-width modulated mode, or for which the current IOUT is above the specified threshold value with the first switch $S_1$ switched on, and to permanently switch off the first switch $S_1$ and/or output an error signal if this duration exceeds a specified time threshold. In the latter case, it can be assumed that there is a fault in the load, such as a short circuit.

What is claimed is:

1. An electronic circuit comprising:
    an output, which is configured to be connected to a load; and
    a first supply circuit and a second supply circuit, which are each connected to the output, and each comprise:
    a supply input, which is configured to receive a respective input voltage;
    a first circuit node;
    a first electronic switch, which is connected between the output and the first circuit node;
    a first rectifier element connected in parallel with the first electronic switch;
    at least one second electronic switch, which is connected between the supply input and the first circuit node;
    at least one second rectifier element, which is connected in parallel with the at least one second electronic switch, wherein the at least one second rectifier element and the first rectifier element are connected in antiseries with one another; and a control circuit of at least one of the first and second supply circuits, wherein the control circuit is directly coupled to the first circuit node and coupled to the output, which is configured:

to activate the first electronic switch and the second electronic switch and to receive a supply voltage from the first circuit node at a supply input.

2. The electronic circuit as claimed in claim 1, wherein the control circuit of at least one of the first and second supply circuits is configured to switch on the respective first electronic switch if an electrical potential at the first circuit node is higher than the electrical potential at the output.

3. The electronic circuit as claimed in claim 1, wherein the control circuit of at least one of the first and second supply circuits is configured to switch on the respective first electronic switch as soon as the control circuit receives a sufficient supply voltage from the first circuit node.

4. The electronic circuit as claimed in claim 1, wherein the control circuit of at least one of the first and second supply circuits is configured to switch on provide the respective at least one second switch if the respective input voltage is higher than an output voltage at the output.

5. The electronic circuit as claimed in claim 4, wherein the control circuit of the at least one of the first and second supply circuits is configured to limit a respective output current by a pulse-width modulated activation of the first electronic switch if the respective output current has a predefined second current direction.

6. The electronic circuit as claimed in claim 1, wherein at least one of the first and second supply circuits additionally comprises:

a current measurement arrangement configured to detect at least one current direction of an output current of the respective supply circuit.

7. The electronic circuit as claimed in claim 6, wherein the control circuit of the at least one of the first and second supply circuits is configured to switch off the respective at least one second switch depending on a measured output current.

8. The electronic circuit as claimed in claim 6, wherein the control circuit of the at least one of the first and second supply circuits is configured to switch off the at least one second switch depending on a measured output current if the measured output current has a predefined first current direction wherein the measured output current flows from the output into the respective supply circuit.

9. The electronic circuit as claimed in claim 1, wherein the control circuit of at least one of the first and second supply circuits has an internal supply circuit which is configured to generate at least one internal supply voltage based on the supply voltage received from the first circuit node.

10. The electronic circuit as claimed in claim 9, wherein the internal supply circuit has an evaluation circuit, which is configured to evaluate the supply voltage received from the respective first circuit node and wherein the internal supply circuit is configured to generate the at least one internal supply voltage depending on a result of the evaluation.

11. The electronic circuit as claimed in claim 1, wherein in at least one of the first and second supply circuits the first electronic switch has a MOSFET and the first rectifier element is a body diode of the MOSFET.

12. The electronic circuit as claimed in claim 11,
wherein in the first and second supply circuit the first electronic switch is a MOSFET,
wherein the MOSFET is an n-conducting MOSFET, and
wherein a drain terminal of each of the MOSFETs is connected to the output.

13. The electronic circuit as claimed in claim 1, wherein in at least one of the first and second supply circuits the at least one second electronic switch has a MOSFET and the at least one second rectifier element is a body diode of the MOSFET.

14. The electronic circuit as claimed in claim 1, wherein the at least one second electronic switch has two second switches connected in series.

15. An electronic circuit comprising:
an output, which is configured to be connected to a load; and
a first supply circuit and a second supply circuit, which are each connected to the output, and each comprise:
a supply input, which is configured to receive a respective input voltage;
a first circuit node;
a first electronic switch, which is connected between the output and the first circuit node;
a first rectifier element connected in parallel with the first electronic switch;
at least one second electronic switch, which is connected between the supply input and the first circuit node;
at least one second rectifier element, which is connected in parallel with the at least one second electronic switch, wherein the at least one second rectifier element and the first rectifier element are connected in antiseries with one another; and
a control circuit, which is configured:
to activate the first electronic switch and the second electronic switch and
to receive a supply voltage from the first circuit node at a supply input,
wherein at least one of the first and second supply circuits further comprises a current measurement arrangement configured to detect at least one current direction of an output current of the respective supply circuit.

16. The electronic circuit as claimed in claim 15, wherein the control circuit of the at least one of the first and second supply circuits is configured to switch off the at least one second electronic switch depending on a measured output current.

17. The electronic circuit as claimed in claim 15, wherein the control circuit of the at least one of the first and second supply circuits is configured to switch off the at least one second electronic switch depending on a measured output current if the measured output current has a predefined first current direction wherein the measured output current flows from the output into the respective supply circuit.

18. An electronic circuit comprising:
an output, which is configured to be connected to a load; and
a first supply circuit and a second supply circuit, which are each connected to the output, and each comprise:
a supply input, which is configured to receive a respective input voltage;
a first circuit node;

a first electronic switch, which is connected between the output and the first circuit node;
a first rectifier element connected in parallel with the first electronic switch;
at least one second electronic switch, which is connected between the supply input and the first circuit node;
at least one second rectifier element, which is connected in parallel with the at least one second electronic switch, wherein the at least one second rectifier element and the first rectifier element are connected in antiseries with one another; and
a control circuit, which is configured:
to activate the first electronic switch and the second electronic switch and
to receive a supply voltage from the first circuit node at a supply input,
wherein the at least one second electronic switch comprises two second switches connected in series.

19. The electronic circuit as claimed in claim 18, wherein at least one of the first and second switches comprises a MOSFET transistor.

20. The electronic circuit as claimed in claim 18, wherein at least one of the first and second switch comprises an IGBT transistor.

* * * * *

UNITED STATES PATENT AND TRADEMARK OFFICE
CERTIFICATE OF CORRECTION

PATENT NO. : 11,115,016 B2
APPLICATION NO. : 17/034945
DATED : September 7, 2021
INVENTOR(S) : Bilstein It is certified that error appears in the above-identified patent and that said Letters Patent is hereby corrected as shown below:

In the Claims

In Column 13, Line 27-28, Claim 4, delete "provide the respective".

In Column 13, Line 45, Claim 7, delete "respective".

In Column 13, Line 63, Claim 10, delete "respective".

Signed and Sealed this
Twenty-third Day of November, 2021

Drew Hirshfeld
*Performing the Functions and Duties of the*
*Under Secretary of Commerce for Intellectual Property and*
*Director of the United States Patent and Trademark Office*